US006754857B2

(12) United States Patent
Liang

(10) Patent No.: US 6,754,857 B2
(45) Date of Patent: Jun. 22, 2004

(54) METHOD OF TESTING CACHE MEMORY

(75) Inventor: Ching-Jer Liang, Hsinchu Hsien (TW)

(73) Assignee: Faraday Technology Corp., Hsinchu (TW)

( * ) Notice: Subject to any disclaimer, the term of this patent is extended or adjusted under 35 U.S.C. 154(b) by 412 days.

(21) Appl. No.: 09/945,030

(22) Filed: Aug. 30, 2001

(65) Prior Publication Data

US 2003/0046620 A1 Mar. 6, 2003

(51) Int. Cl.[7] ................................................ G11C 29/00
(52) U.S. Cl. ...................................................... 714/719
(58) Field of Search ................................ 714/719, 718, 714/720, 730, 42; 711/137; 365/201, 200

(56) References Cited

U.S. PATENT DOCUMENTS

H1741 H * 7/1998 Cruts ......................... 714/720
5,831,987 A * 11/1998 Spilo .......................... 714/719

* cited by examiner

*Primary Examiner*—Albert Decady
*Assistant Examiner*—James Kerveros
(74) *Attorney, Agent, or Firm*—J.C. Patents

(57) ABSTRACT

A method of testing cache memory is used in a memory system having a primary memory unit and a cache memory unit. The method first writes a block of test data into the cache memory unit. Then, the test data is converted by a first encoding process into a first block of encoded data. The first block if encoded data is written into the primary memory unit. Data from the primary memory unit is fetched. The fetched data from the primary memory unit is converted by a second encoding process into a second block of encoded data. The second block of encoded data is stored into the cache memory unit. Either the first block of encoded data or the second block of encoded data is compared with a predetermined block of reference data to check whether the read/write operation to the cache memory unit is normal.

12 Claims, 2 Drawing Sheets

METHOD OF TESTING CACHE MEMORY

BACKGROUND OF THE INVENTION

1. Field of the Invention

This invention relates to memory testing technology, and more particularly, to a method of testing cache memory.

2. Description of Related Art

Cache memory is a special memory subsystem in a computer, which is used to stored a copy of the most frequently used data in the primary memory. Since cache memory is faster in access speed than primary memory, it allows an increase in data access speed, thereby making the program execution faster. When the CPU references an address in the primary memory and if that address is held in the cache memory, the data is returned to the CPU from the cache memory instead of from the primary memory. The use of cache memory can significantly enhance data access speed, thus increasing the performance of program execution. To ensure the reliability of data stored in cache memory, it is an essential step in the manufacture of cache memory to test whether the cache memory would operate correctly in read/write operations.

One conventional method for testing cache memory is to provide an additional hardware architecture to the cache memory for the implementation of the testing procedure on the cache memory. The required hardware architecture can be provided in two ways:

(1) Build-In memory Self-Test mode (BIST), which is an internal hardware architecture in the cache memory; and (2) External hardware support, which can supply a set of special instructions to the cache memory being tested for performing simulated read/write operations on the cache memory.

One drawback to the use of additional hardware architecture to the cache memory for implementing the testing procedure, however, would require additional circuit layout space to realize, and thus is quite cost-ineffective to implement. Moreover, it would result in a slower access speed to the cache memory.

SUMMARY OF THE INVENTION

It is therefore an objective of this invention to provide a new method for testing cache memory, which can be implemented without having to provide additional hardware architecture for implementing the testing procedure, so as to make the testing of the cache memory more cost-effective to implement than the prior art.

In accordance with the foregoing and other objectives, the invention proposes a new method for testing cache memory, which is based on the hit/miss and encoding of data in the cache memory to test whether the cache memory would operate normally in read/write operations.

The method of the invention is designed for use on a memory system having a primary memory unit and a cache memory unit for testing the cache memory unit to check if the cache memory unit is normal in read/write operations. The method of the invention is applicable to any kind of write operation on primary memory (including programmed direct access, or read/write operation on cache memory). In one embodiment, the method according to the invention comprises the following steps: writing a block of test data into the cache memory unit; converting the test data through a first encoding process into a first block of encoded data; writing the first block of encoded data into the primary memory unit; fetching data from the primary memory unit; converting the fetched data from the primary memory unit through a second encoding process into a second block of encoded data; and then, storing the second block of encoded data into the cache memory unit; and finally comparing either the first block of encoded data or the second block of encoded data against a predetermined block of reference data to check whether the read/write operation to the cache memory unit is normal. The cache memory unit can be embedded in a microprocessor; and no encoding process is performed during any read/write operation between the CPU (Central Processing Unit) and the cache memory.

In one preferred embodiment of the invention, the fetched data from the primary memory unit is the first block of encoded data; and the predetermined block of reference data for the first block of encoded data is obtained through a first logic operation on the test data; and the predetermined block of reference data for the second block of encoded data is obtained through a second logic operation on the fetched data from the primary memory unit.

In another embodiment, the method according to the invention comprises the following steps: writing a block of test data into the cache memory unit; converting the test data through an encoding process into a block of encoded data; writing the encoded data into the primary memory unit; fetching data from the primary memory unit; and then, storing the fetched data from the primary memory unit into the cache memory unit; and finally, comparing either the block of encoded data or the block of fetched data against a predetermined block of reference data to check whether the read/write operation to the cache memory unit is normal.

In one preferred embodiment of the invention, the fetched data from the primary memory unit is the encoded data; and the predetermined block of reference data for the block of encoded data is obtained through a first logic operation on the encoded data; and the predetermined block of reference data for the fetched data from the primary memory unit is obtained through a second logic operation on the fetched data from the primary memory unit.

In another embodiment, the method according to the invention comprises the following steps: writing a block of test data into the cache memory unit; writing the test data into the primary memory unit; fetching data from the primary memory unit; converting the fetched data from the primary memory unit through an encoding process into a block of encoded data; and storing the encoded data into the cache memory unit; and finally, comparing either the block of test data or the block of encoded data against a predetermined block of reference data to check whether the read/write operation to the cache memory unit is normal.

In one preferred embodiment of the invention, the fetched data from the primary memory unit is the test data; and the predetermined block of reference data for the block of test data is obtained through a first logic operation on the test data; and the predetermined block of reference data for the block of encoded data is obtained through a second logic operation on the fetched data from the primary memory unit.

In conclusion, the invention is characterized in that the encoding method for the write operation of data from cache memory to primary memory is different from that for the read operation of data by the cache memory from the primary memory. This feature allows the testing procedure to be performed without having to provide additional hardware architecture, allowing the testing procedure to be more cost-effective to implement than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
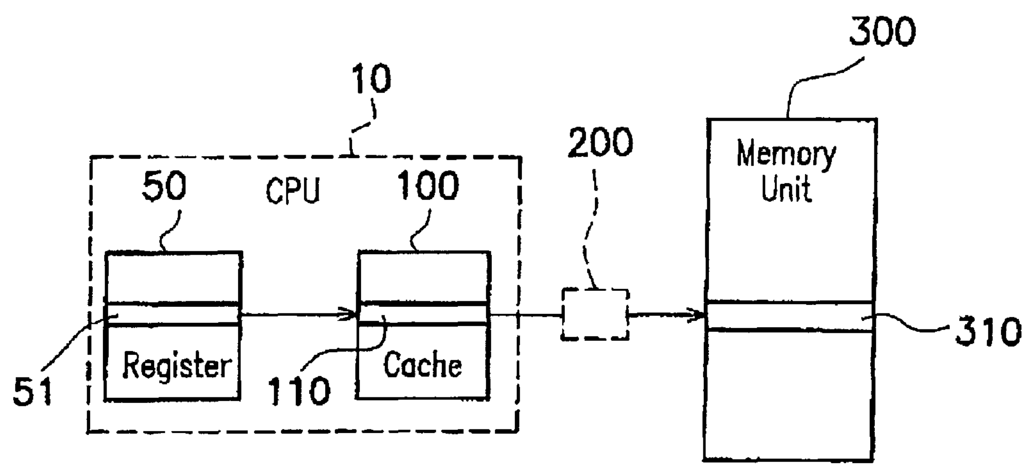
FIG. 1 is a schematic diagram showing a write operation of data from cache memory to primary memory by the method according to the invention.
Figure 2:
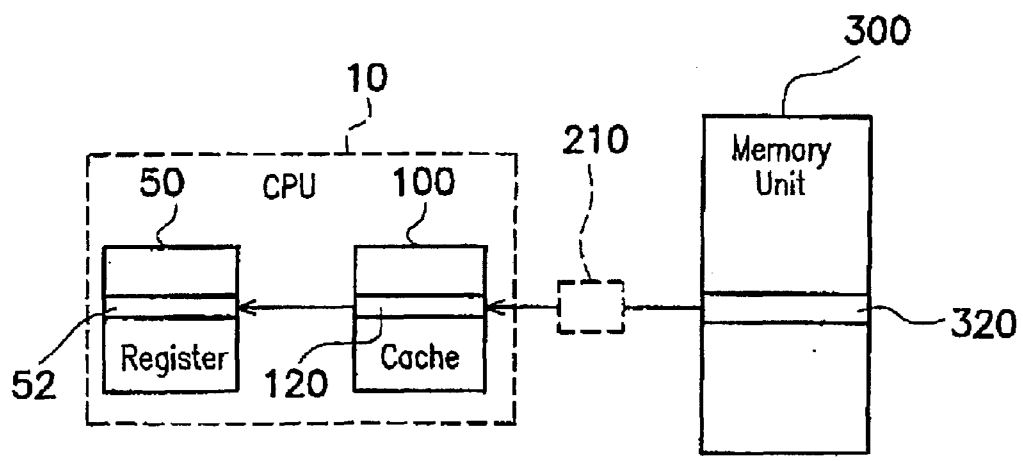
FIG. 2 is a schematic diagram showing a read operation of data by cache memory from primary memory by the method according to the invention.

Referring to FIG. 1 together with FIG. 2, the invention is designed for on a memory system having a cache memory unit 100 and a primary memory unit 300. The cache memory unit 100 includes a number of address locations, for example the address 110 and the address 120 for storing a copy of most frequently accessed data in the primary memory unit 300. The primary memory unit 300 also includes a number of address locations, for example the address 310 and the address 320 for storing program code and data.

FIG. 1 shows a write operation of data from a storage area 51 in a register file 50 in a CPU 10 to a certain address 110 in the cache memory unit 100; and during this write operation, no encoding process is performed. The data stored in the address 110 of the cache memory unit 100 is written to an address 310 in the primary memory unit 300 through a first encoding process 200.

FIG. 2 shows a read operation of data by the cache memory unit 100 from the primary memory unit 300. As shown, assume the data stored in the address 320 of the primary memory unit 300 is to be read and stored into the address 120 of the cache memory unit 100. The data is then read by the CPU 10 back to the storage area 52 in the register 50. The first encoding process can be optionally utilized or arbitrarily selected from a number of available encoding schemes to encode the data written from the cache memory unit 100 into the primary memory unit 300; and similarly, the second encoding process can be optionally utilized or arbitrarily selected from a number of available encoding schemes to encode the fetched data from the primary memory unit 300. The first encoding process can also be the same as the second encoding process. Moreover, the first encoding process and the second encoding process can be each an unsymmetrical encoding method, which allows the data written into the cache memory unit 100 to be different from the data read by the cache memory unit 100 from the primary memory unit 300. In this way, the testing on the cache memory can be achieved. During the forgoing read or write operation between the CPU and the cache memory, no encoding process is performed. In addition to CPU, the invention is also applicable to a microprocessor that is embedded with cache memory.

Figure 3:
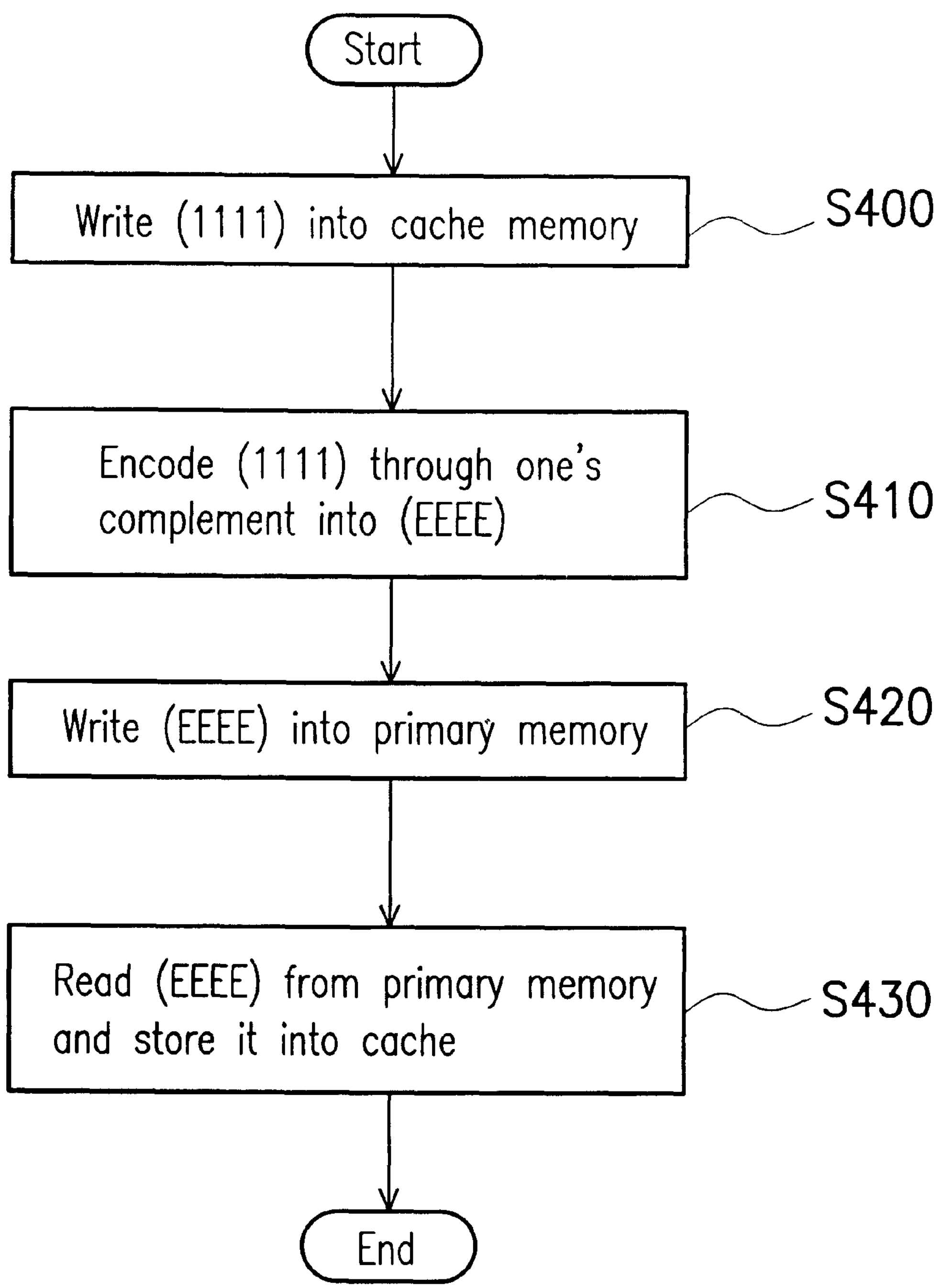
FIG. 3 is a flow diagram showing the procedural steps involved in a preferred embodiment of the method according to the invention for testing cache memory.

FIG. 3 is a flow diagram showing the procedural steps involved in a preferred embodiment of the method according to the invention for testing the cache memory unit 100. As shown, in the first step S400, a block of test data (1111) is written into the cache memory unit 100. In the next step S410, the test data (1111) is converted through a selected encoding process, such as one's complement, into (EEEE). In the next step S420, the encoded data (EEEE) is stored into the primary memory unit 300. In the next step S430, the encoded data (EEEE) stored in the primary memory unit 300 is read and stored back into the cache memory unit 100, and which is compared to a block of reference data derived from the test data to see if it is correct in binary value. If YES, it indicates that the cache memory unit 100 being tested would operate normally in read/write operations; otherwise, it indicates that the cache memory unit 100 is defective. The reference data is predetermined by test engineers before actually performing the testing procedure and then input to the cache memory unit 100 for comparison. Through repeatedly performing this procedure, all the address locations in the cache memory unit 100 can be tested to see whether any of the memory cells in the cache memory unit 100 is defective.

In conclusion, the invention provides a new method for testing cache memory, which is characterized in that the encoding scheme for the write operation of data from cache memory to primary memory is different from the encoding scheme for the read operation of data by the cache memory from the primary memory. This feature allows the testing procedure to be performed without having to provide additional hardware architecture to the cache memory, thus allowing the testing procedure to be more cost-effective to implement than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for use on a memory system having a primary memory unit and a cache memory unit for testing the cache memory unit, comprising the steps of:

writing a block of test data into the cache memory unit; then, converting the test data through a first encoding process into a first block of encoded data; and then writing the first block of encoded data into the primary memory unit;

fetching data from the primary memory unit; then converting the fetched data from the primary memory unit through a second encoding process into a second block of encoded data; and then storing the second block of encoded data into the cache memory unit, wherein the first encoding process is different from the second encoding process; and comparing either the first block of encoded data or the second block of encoded data against a predetermined block of reference data to check whether the read/write operation to the cache memory unit is normal.

2. The method of claim 1, wherein the cache memory unit is embedded in a microprocessor.

3. The method of claim 1, wherein the fetched data from the primary memory unit is the first block of encoded data.

4. The method of claim 1, wherein the predetermined block of reference data for the first block of encoded data is obtained through a first logic operation on the test data; and the predetermined block of reference data for the second block of encoded data is obtained through a second logic operation on the fetched data from the primary memory unit.

5. A method for use on a memory system having a primary memory unit and a cache memory unit for testing the cache memory unit, comprising the steps of:

writing a block of test data into the cache memory unit; then, converting the test data through an encoding process into a block of encoded data; and then, writing the encoded data into the primary memory unit;

fetching data from the primary memory unit; and then, storing the fetched data from the primary memory unit into the cache memory unit; and comparing either the block of encoded data or the block of fetched data against a predetermined black of reference data to check whether the read/write operation to the cache memory unit is normal.

6. The method of claim 5, wherein the cache memory unit is embedded in a microprocessor.

7. The method of claim 5, wherein the fetched data from the primary memory unit is the encoded data.

8. The method of claim 5, wherein the predetermined block of reference data for the block of encoded data is obtained through a first logic operation on the encoded data; and the predetermined block of reference data for the fetched data from the primary memory unit is obtained through a second logic operation on the fetched data from the primary memory unit.

9. A method for use on a memory system having a primary memory unit and a cache memory unit for testing the cache memory unit, comprising the steps of:

writing a block of test data into the cache memory unit; and then, writing the test data into the primary memory unit;

fetching data from the primary memory unit; then, converting the fetched data from the primary memory unit through an encoding process into a block of encoded data; and then, storing the encoded data into the cache memory unit; and comparing either the block of test data or the block of encoded data against a predetermined block of reference data to check whether the read/write operation to the cache memory unit is normal.

10. The method of claim 9, wherein the cache memory unit is embedded in a microprocessor.

11. The method of claim 9, wherein the fetched data from the primary memory unit is the test data.

12. The method of claim 9, wherein the predetermined block of reference data for the block of test data is obtained through a first logic operation on the test data; and the predetermined block of reference data for the block of encoded data is obtained through a second logic operation on the fetched data from the primary memory unit.

* * * * *